United States Patent
Kawachi

(10) Patent No.: US 11,639,913 B2
(45) Date of Patent: May 2, 2023

(54) SENSOR DEVICE

(71) Applicant: Tianma Japan, Ltd., Kanagawa (JP)

(72) Inventor: Genshiro Kawachi, Kanagawa (JP)

(73) Assignee: TIANMA JAPAN, LTD., Kanagawa (JP)

(*) Notice: Subject to any disclaimer, the term of this patent is extended or adjusted under 35 U.S.C. 154(b) by 995 days.

(21) Appl. No.: 16/436,428

(22) Filed: Jun. 10, 2019

(65) Prior Publication Data
US 2019/0376924 A1   Dec. 12, 2019

(30) Foreign Application Priority Data

Jun. 8, 2018 (JP) .............................. JP2018-110267
Feb. 7, 2019 (JP) .............................. JP2019-020800
Mar. 19, 2019 (JP) .............................. JP2019-051441

(51) Int. Cl.
G01N 27/414 (2006.01)
H01L 29/786 (2006.01)
G01N 27/26 (2006.01)
G01N 27/30 (2006.01)

(52) U.S. Cl.
CPC .......... *G01N 27/414* (2013.01); *G01N 27/26* (2013.01); *G01N 27/30* (2013.01); *G01N 27/4148* (2013.01); *H01L 29/7869* (2013.01)

(58) Field of Classification Search
CPC ............. G01N 27/414; G01N 27/4141; G01N 27/4148
See application file for complete search history.

(56) References Cited

U.S. PATENT DOCUMENTS

| | | | |
|---|---|---|---|
| 4,589,970 A * | 5/1986 | Ligtenberg | G01N 27/4141 204/406 |
| 4,694,834 A | 9/1987 | Meyerhoff et al. | |
| 4,776,203 A * | 10/1988 | Jones | G01N 27/4141 73/31.06 |
| 5,011,589 A * | 4/1991 | Amemiya | G01N 27/414 204/419 |
| 5,309,085 A | 5/1994 | Sohn | |
| 6,203,981 B1 * | 3/2001 | Ackley | G01N 33/5438 435/7.1 |
| 9,046,482 B2 * | 6/2015 | Kamata | H01L 27/12 |

(Continued)

FOREIGN PATENT DOCUMENTS

CN 101154672 A 4/2008
CN 105954322 A 9/2016
(Continued)

OTHER PUBLICATIONS

Maxim Integrated™ Application Note 3611, Sep. 23, 2005, author unknown, 14 pages (Year: 2005).*

(Continued)

*Primary Examiner* — Alexander S Noguerola
(74) *Attorney, Agent, or Firm* — Nixon & Vanderhye

(57) ABSTRACT

A sensor device is disclosed. The sensor device includes a monitor thin film transistor, a reference thin film transistor, and a control unit. The control unit is configured to determine a value measured from a sample based on a differential degree between output current of the reference thin film transistor and output current of the monitor thin film transistor.

4 Claims, 11 Drawing Sheets

(56) References Cited

U.S. PATENT DOCUMENTS

| | | | |
|---|---|---|---|
| 2006/0174683 A1* | 8/2006 | Bonne | G01N 27/4141 73/1.02 |
| 2008/0078923 A1 | 4/2008 | Hirose | |
| 2011/0090006 A1 | 4/2011 | Yamazaki et al. | |
| 2011/0132773 A1* | 6/2011 | Liemersdorf | G01N 27/4148 257/253 |
| 2015/0276663 A1* | 10/2015 | Takechi | H01L 29/7869 257/253 |
| 2017/0082570 A1 | 3/2017 | Takechi et al. | |
| 2018/0095052 A1 | 4/2018 | Jun | |

FOREIGN PATENT DOCUMENTS

| | | | | |
|---|---|---|---|---|
| CN | 107024522 A | | 8/2017 | |
| GB | 2416210 A | * | 1/2006 | G01N 27/414 |
| JP | H04254750 A | | 9/1992 | |
| JP | 2001-511245 A | | 8/2001 | |
| JP | 2015-190848 A | | 11/2015 | |
| JP | 2017-058320 A | | 3/2017 | |
| KR | 1020070130954 A | * | 8/2008 | G01N 27/12 |
| TW | 200821557 A | | 5/2008 | |

OTHER PUBLICATIONS

Ghallab et al., "A New Differential pH Sensor Current Mode Read-Out Circuit Using Only Two Operational Floating Current Conveyor," 2004 IEEE International Workshop on Biomedical Circuits and Systems, pp. S1.5-13 to S1.5-16 (Year: 2004).*

Korean Intellectual Property Office computer-generated English language translation Gida Masahito KR 10-2007-0130954 A, patent application published Aug. 4, 2008, downloaded Sep. 8, 2022. (Year: 2008).*

Office Action issued in Chinese Patent Application No. 201910410493.9 dated Sep. 29, 2022.

Office Action issued in Japanese Patent Application No. 2019-051441 dated Jan. 10, 2023.

* cited by examiner

SENSOR DEVICE

CROSS-REFERENCE TO RELATED APPLICATIONS

This Non-provisional application claims priority under 35 U.S.C. § 119(a) on Patent Application No. 2018-110267 filed in Japan on Jun. 8, 2018, Patent Application No. 2019-20800 filed in Japan on Feb. 7, 2019, and Patent Application No. 2019-51441 filed in Japan on Mar. 19, 2019, the entire contents of which are hereby incorporated by reference.

BACKGROUND

This disclosure relates to a sensor device.

Thin film transistor (TFT) ion sensors that utilize the shift of the gate threshold voltage Vth (also referred to as Vth shift) of a TFT are disclosed, for example in US 2015/0276663 A. The TFT sensor disclosed therein has a gate electrode and a reference electrode; the capacitance of the ion-sensitive insulating film is larger than the capacitance of the gate insulating film. The TFT sensor determines the ionic level of an object based on the threshold voltage shift in the gate-source voltage vs source-drain current characteristics.

SUMMARY

An aspect of this disclosure is a sensor device including: a monitor thin film transistor; a reference thin film transistor; and a control unit configured to determine a value measured from a sample based on a differential degree between output current of the reference thin film transistor and output current of the monitor thin film transistor.

It is to be understood that both the foregoing general description and the following detailed description are exemplary and explanatory and are not restrictive of this disclosure.

EMBODIMENTS

Hereinafter, embodiments of this disclosure will be described with reference to the accompanying drawings. It should be noted that the embodiments are merely examples to implement the features of this disclosure and are not to limit the technical scope of this disclosure.

The thin film transistor (TFT) sensor device in this disclosure includes a TFT pair consisting of a monitor TFT and a reference TFT. The monitor TFT is exposed to a sample and the reference TFT is isolated from the sample. The TFT sensor device determines a value to be measured from the sample based on the differential degree between the output current from the monitor TFT and the output current from the reference TFT.

The differential degree is expressed by a desired function such as a difference acquired by subtraction or a ratio acquired by division. The value to be measured can be a value of pH or intensity of light, for example. The configuration in this disclosure reduces the output drift in a TFT sensor device caused by external environmental factors, achieving smaller measurement error. Hereinafter, details of the embodiments are described with reference to the drawings.

Overall Configuration of TFT Sensor Device

Figure 1:
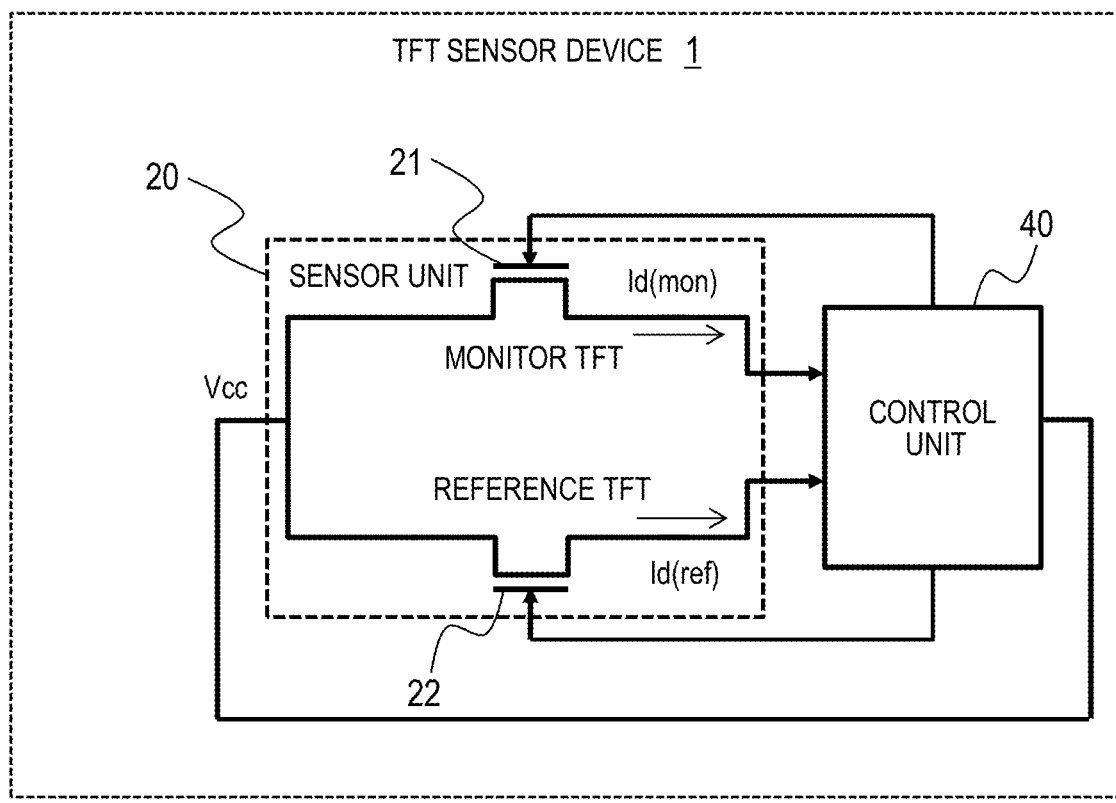
FIG. 1 illustrates a general configuration of a TFT sensor device in an embodiment.

FIG. 1 illustrates a general configuration of a TFT sensor device in an embodiment. The TFT sensor device 1 includes a sensor unit 20 and a control unit 40. The sensor unit 20 in this embodiment includes two TFTs. One is a monitor TFT 21 and the other is a reference TFT 22. The monitor TFT 21 and the reference TFT 22 are connected in parallel between a power supply Vcc and the control unit 40.

The supply voltage Vcc is applied to the drains of the monitor TFT 21 and the reference TFT 22. The electric current Id(mon) output from the source of the monitor TFT 21 and the electric current Id(ref) output from the source of the reference TFT 22 enter the control unit 40.

The control unit 40 controls the monitor TFT 21 and the reference TFT 22 and further, measures a specific value of the object to be measured based on the output currents from the monitor TFT 21 and the reference TFT 22. Hereinafter, an example of measuring the pH of an object (sample) is described; however, the features of this disclosure are applicable to a TFT sensor device for detecting a physical value different from pH, such as light or contact.

The TFT sensor device 1 determines the pH of an unknown sample based on the shift amount of the gate threshold voltage (Vth) of the monitor TFT 21 caused by the unknown sample. The monitor TFT 21 is exposed to (contacts) the sample and the reference TFT 22 is not exposed to (isolated from) the sample.

For example, the control unit 40 adjusts the gate voltage of the monitor TFT 21 or the reference TFT 22 to equalize the output current (drain current) of the monitor TFT 21 and the output current (drain current) of the reference TFT 22 to determine the shift amount of the gate threshold voltage (Vth) of the monitor TFT 21 caused by an unknown sample.

The control unit 40 may hold in advance information indicating the relations of differential degrees between the output current of the monitor TFT 21 and the output current of the reference TFT 22 to Vth shift amounts to determine the Vth shift amount of the monitor TFT 21 based on the output currents of the monitor TFT 21 and the reference TFT 22 and this information.

Figure 2:
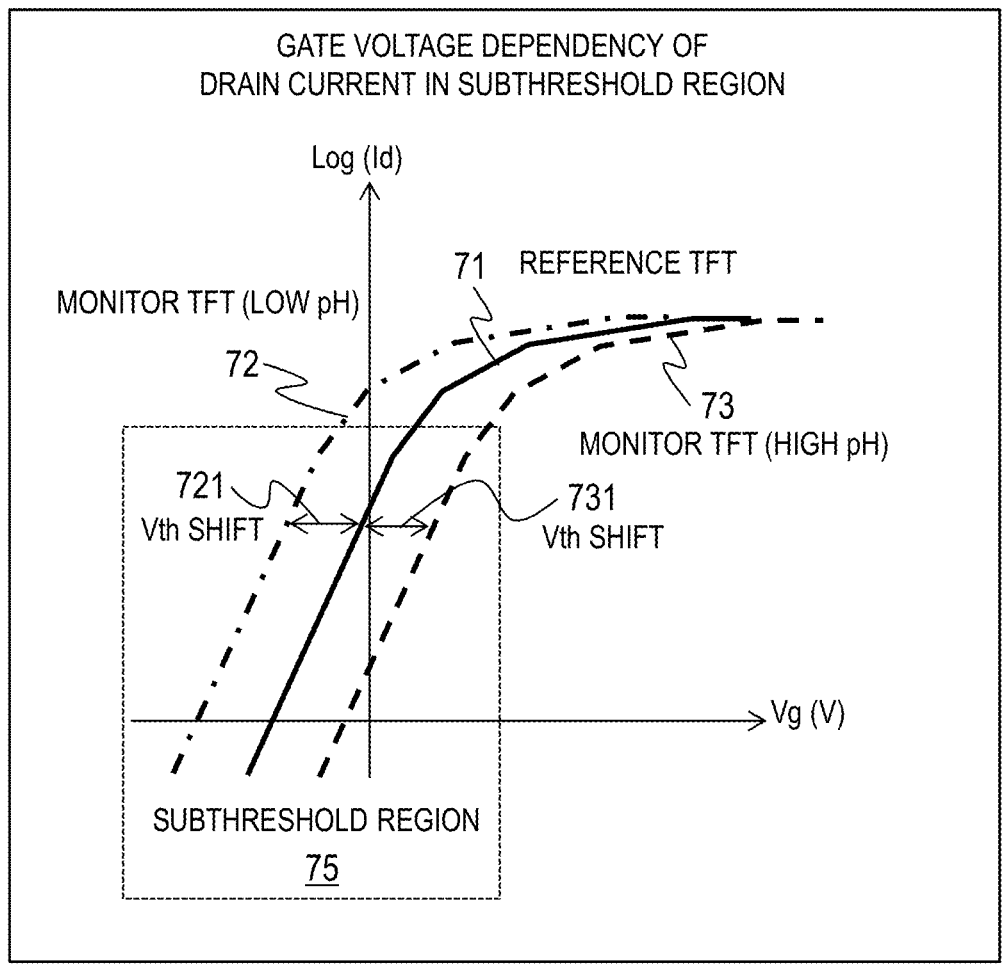
FIG. 2 illustrates gate voltage dependency of drain current in the subthreshold region.

FIG. 2 illustrates gate voltage dependency of drain current in the subthreshold region. The horizontal axis represents gate potential and the vertical axis represents the logarithm of drain current Id. In the example described in the following, the control unit 40 makes the monitor TFT 21 and the reference TFT 22 operate in the subthreshold region (weak inversion region) by controlling their gate potentials. As a result, the sensor unit 20 attains high sensitivity. The sensitivity can be raised further by employment of a semiconductor having a small subthreshold coefficient S such as an oxide semiconductor.

In the graph of FIG. 2, the solid line 71 represents the characteristic of the reference TFT 22 isolated from the sample. The dashed-dotted line 72 represents the characteristic of the monitor TFT 21 exposed to a low-pH sample. The dashed line 73 represents the characteristic of the monitor TFT 21 exposed to a high-pH sample.

As illustrated in FIG. 2, the voltage threshold Vth of the monitor TFT 21 decreases with decrease in measured pH and increases with increase in measured pH. The Vth shift amount of the monitor TFT 21 is a difference between the gate potential of the reference TFT 22 and the gate potential of the monitor TFT 21 for the monitor TFT 21 to output a current equal to the output current Id of the reference TFT 22. FIG. 2 provides a shift amount 721 in the case of a low pH value and a shift amount 731 in the case of a high pH value.

The output current Id of the monitor TFT 21 can be made closer to the output current Id of the reference TFT 22 by changing the gate potential (gate bias) of the monitor TFT 21, specifically by raising the gate potential of the monitor TFT 21 exposed to a low-pH sample or lowering the gate potential of the monitor TFT 21 exposed to a high-pH sample. The adjustment amount of the gate potential of the monitor TFT 21 corresponds to the Vth shift amount of the monitor TFT 21 caused by the sample.

Configuration of Control Unit

Figure 3:
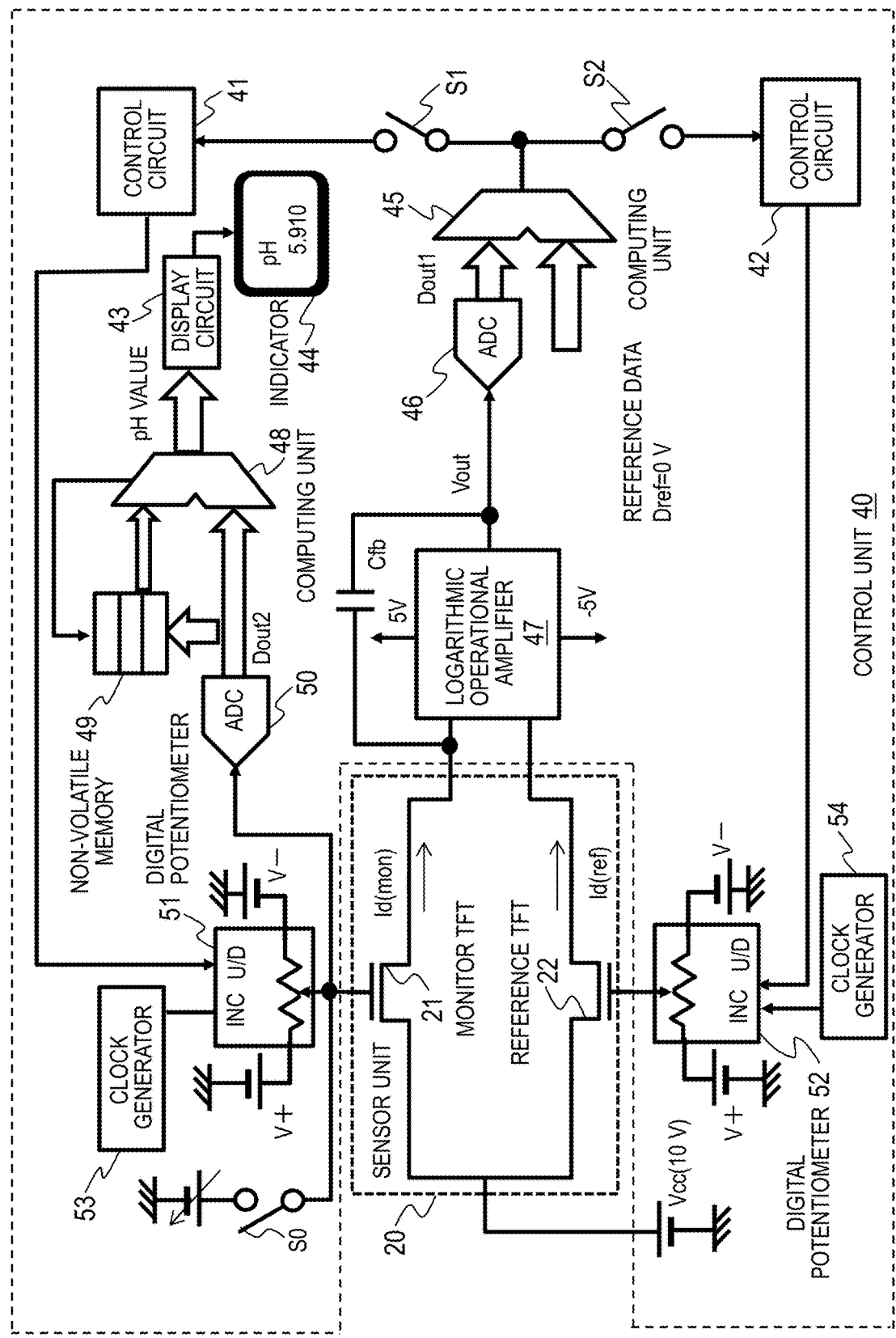
FIG. 3 is a block diagram for illustrating details of a configuration example of the TFT sensor device.

FIG. 3 is a block diagram for illustrating details of a configuration example of the TFT sensor device 1. FIG. 3 omits a reference electrode that is described later. The control unit 40 includes switches S0, S1, and S2, control circuits 41 and 42, a display circuit 43, an indicator 44, computing units 45 and 48, and analog-digital converters (ADCs) 46 and 50. The control unit 40 further includes a logarithmic operational amplifier 47, a non-volatile memory 49, digital potentiometers 51 and 52, and clock generators 53 and 54. The control unit 40 may further include not-shown control circuits.

The switch S0 opens and closes the connection between the ground for applying a reference gate potential and the gate of the monitor TFT 21. The reference gate potential to be applied to the gate of the monitor TFT 21 can be different from the ground potential. The digital potentiometer 51 is a variable resistor to apply a potential between V− and V+ to the gate of the monitor TFT 21. The digital potentiometer 51 changes the output potential in synchronization with the clock signal from the clock generator 53. The digital potentiometer 51 is controlled by the control circuit 41.

The analog-digital converter 50 converts the analog value of the potential the digital potentiometer 51 applies to the gate of the monitor TFT 21 to a digital value. The computing unit 48 calculates a pH value based on the information stored in the non-volatile memory 49 and the output value Dout2 of the analog-digital converter 50.

As will be described later, the computing unit 48 identifies the relation of an output value of the analog-digital converter 50 to a pH value and stores the information on the result to the non-volatile memory 49. In this process to identify the relation, the output value of the analog-digital converter 50 is stored to the non-volatile memory 49. The display circuit 43 receives data of the pH value from the computing unit 48 and displays the value on the indicator 44.

The digital potentiometer 52 is a variable resistor and applies a potential between V− and V+ to the gate of the reference TFT 22. The digital potentiometer 52 changes the output potential in synchronization with the clock signal from the clock generator 54. The digital potentiometer 52 is controlled by the control circuit 42.

The logarithmic operational amplifier 47 receives the output current Id(mon) from the monitor TFT 21 and the output current Id(ref) from the reference TFT 22. The logarithmic operational amplifier 47 outputs a value based on the differential degree between the two inputs. Specifically, the logarithmic operational amplifier 47 outputs a value proportional to the logarithm of the ratio between the two inputs. The output Vout of the logarithmic operational amplifier 47 can be expressed as A log(Id(mon)/Id(ref)), where A is a predetermined constant.

In the example of FIG. 3, a capacitor Cfb is connected between one of the inputs and the output of the logarithmic operational amplifier 47. The capacitor Cfb has a function to reduce the noise in the output voltage Vout to improve the S/N ratio. When the capacitance Cfb is larger, better S/N ratio is attained but measurement takes a longer time. When the capacitance Cfb is smaller, measurement takes a shorter time but the S/N ratio is lowered. The capacitor Cfb can be selected to have an optimum value in view of the time to be taken for measurement or the required S/N ratio.

As described above, the TFT sensor device 1 in this example makes the monitor TFT 21 and the reference TFT 22 operate in the subthreshold region. The logarithm of the output current Id of each TFT is proportional to the gate voltage. The difference ΔVth between the Vth of the monitor TFT 21 and the Vth of the reference TFT 22 is expressed by the following formula:

$$\Delta Vth = S^* \log(Id(\text{mon})/Id(\text{ref})),$$

where S represents a subthreshold coefficient.

As described above, the output of the logarithmic operational amplifier 47 is proportional to the logarithm of the ratio between the output current value of the monitor TFT 21 and the output current value of the reference TFT 22. Accordingly, the difference ΔVth is proportional to the output of the logarithmic operational amplifier 47:

$$\Delta Vth = S^*(Vout/k).$$

The logarithmic operational amplifier 47 enables direct measurement of the Vth shift amount of the monitor TFT 21 caused by the measurement sample with a simple circuit configuration.

The analog-digital converter 46 converts the analog output Vout of the logarithmic operational amplifier 47 to a digital value. The computing unit 45 outputs a value based on the differential degree between the output value Dout1 of the analog-digital converter 46 and the reference data Dref. In the example of FIG. 3, the reference data Dref is 0.

The switch S1 opens and closes the connection between the computing unit 45 and the control circuit 41. The switch S2 opens and closes the connection between the computing unit 45 and the control circuit 42. The control circuit 41 controls the output of the digital potentiometer 51 in accordance with the output from the computing unit 45. The control circuit 42 controls the output of the digital potentiometer 52 in accordance with the output from the computing unit 45.

Configuration of Sensor Unit

Figure 4A:
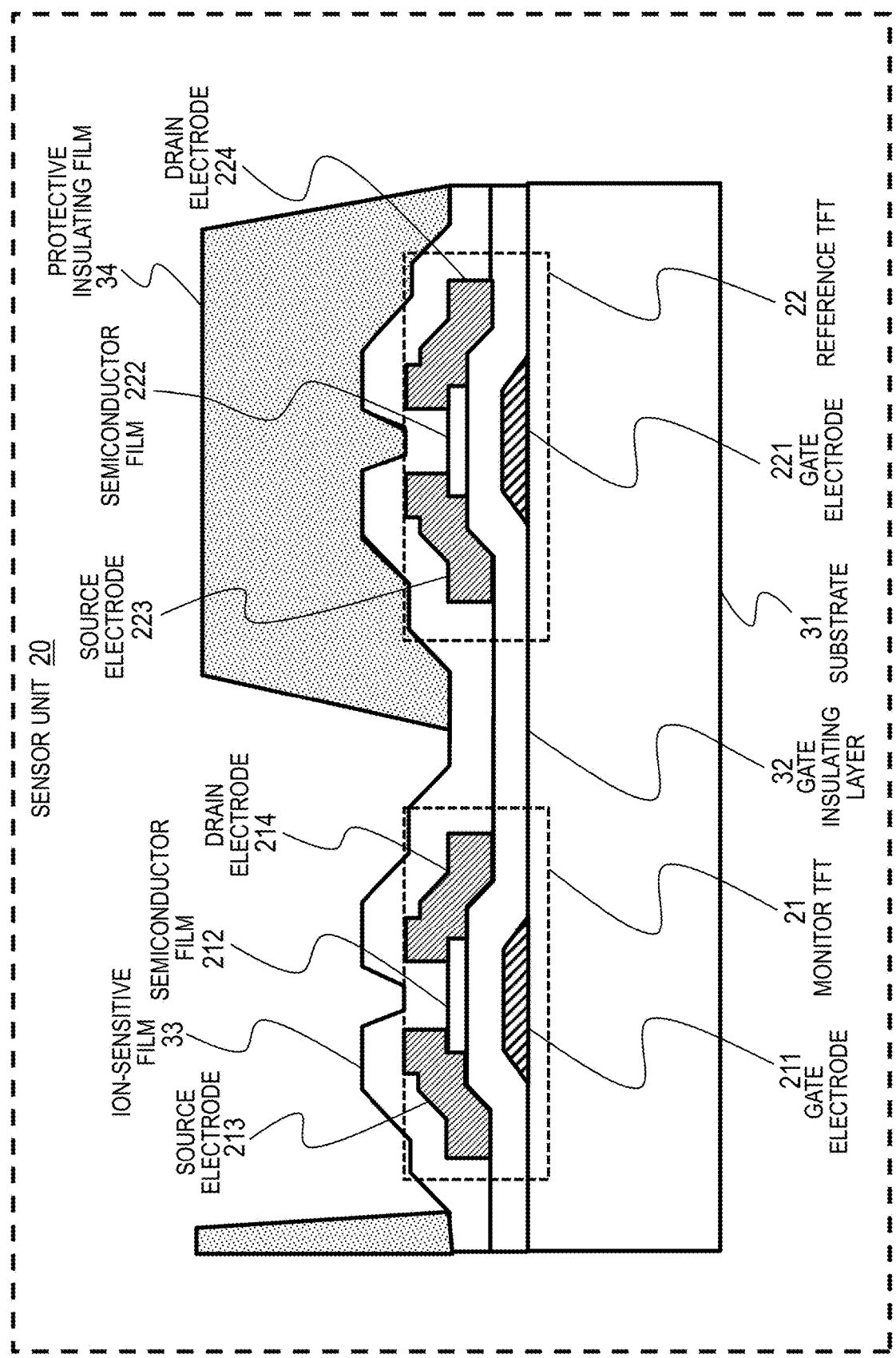
FIG. 4A is a cross-sectional diagram of a configuration example of the sensor unit.

FIG. 4A is a cross-sectional diagram of a configuration example of the sensor unit 20. FIG. 4A illustrates a configuration example of the sensor unit 20 in an ion sensor. The sensor unit 20 includes a monitor TFT 21 and a reference TFT 22 provided on a substrate 31. The monitor TFT 21 and the reference TFT 22 have the same structure. In other words, the constituent elements of the monitor TFT 21 are identical to the constituent elements of the reference TFT 22 in shape, size, and material; the monitor TFT 21 and the reference TFT 22 have substantially the same characteristic values.

The monitor TFT 21 and the reference TFT 22 in this example have a bottom-gate structure. More specifically, the monitor TFT 21 includes a gate electrode 211 on the insulating substrate 31 and a gate insulating layer 32 (a part thereof) covering the gate electrode 211. The monitor TFT 21 further includes a semiconductor film 212 provided above the gate insulating layer 32, and a source electrode 213 and a drain electrode 214 each in contact with a different end of the semiconductor film 212.

The material of the gate electrode 211, the source electrode 213, and the drain electrode 214 can be tantalum, molybdenum, tungsten, aluminum, or the like. The gate insulating layer 32 can be a silicon oxide film, a silicon nitride film, or a composite film of a laminate of a plurality of these films. The semiconductor film 212 can be made of amorphous silicon, poly-silicon, or an oxide semiconductor.

Examples of the oxide semiconductor include amorphous InGaZnO (a-InGaZnO) and microcrystal InGaZnO. Furthermore, an oxide semiconductor such as a-InSnZnO, a-InGaZnSnO, or ZnO can also be employed.

The reference TFT 22 includes a gate electrode 221 on the insulating substrate 31 and a gate insulating layer 32 (a part thereof) covering the gate electrode 221. The reference TFT 22 further includes a semiconductor film 222 provided above the gate insulating layer 32, and a source electrode 223 and a drain electrode 224 each in contact with a different end of the semiconductor film 222.

The material for the gate electrode 221, the source electrode 223, and the drain electrode 224 can be tantalum, molybdenum, tungsten, aluminum, or the like. The gate insulating layer 32 can be made of silicon oxide or a silicon nitride. The semiconductor film 222 can be made of amorphous silicon, poly-silicon, or an oxide semiconductor.

Examples of the oxide semiconductor include amorphous InGaZnO (a-InGaZnO) and microcrystal InGaZnO. Furthermore, an oxide semiconductor such as a-InSnZnO, a-InGaZnSnO, or ZnO can also be employed. The monitor TFT 21 and the reference TFT 22 can have a top-gate structure.

The monitor TFT 21 and the reference TFT 22 are covered by an ion-sensitive film 33. The ion-sensitive film 33 can be made of tantalum oxide, for example. The reference TFT 22 is further covered by a protective insulating film 34. The protective insulating film 34 can be an organic insulating film made of photosensitive polyimide or acrylic resin, or a composite film of a laminate of such an organic insulating film and an inorganic insulating film made of silicon oxide, silicon nitride, or alumina.

Figure 4B:
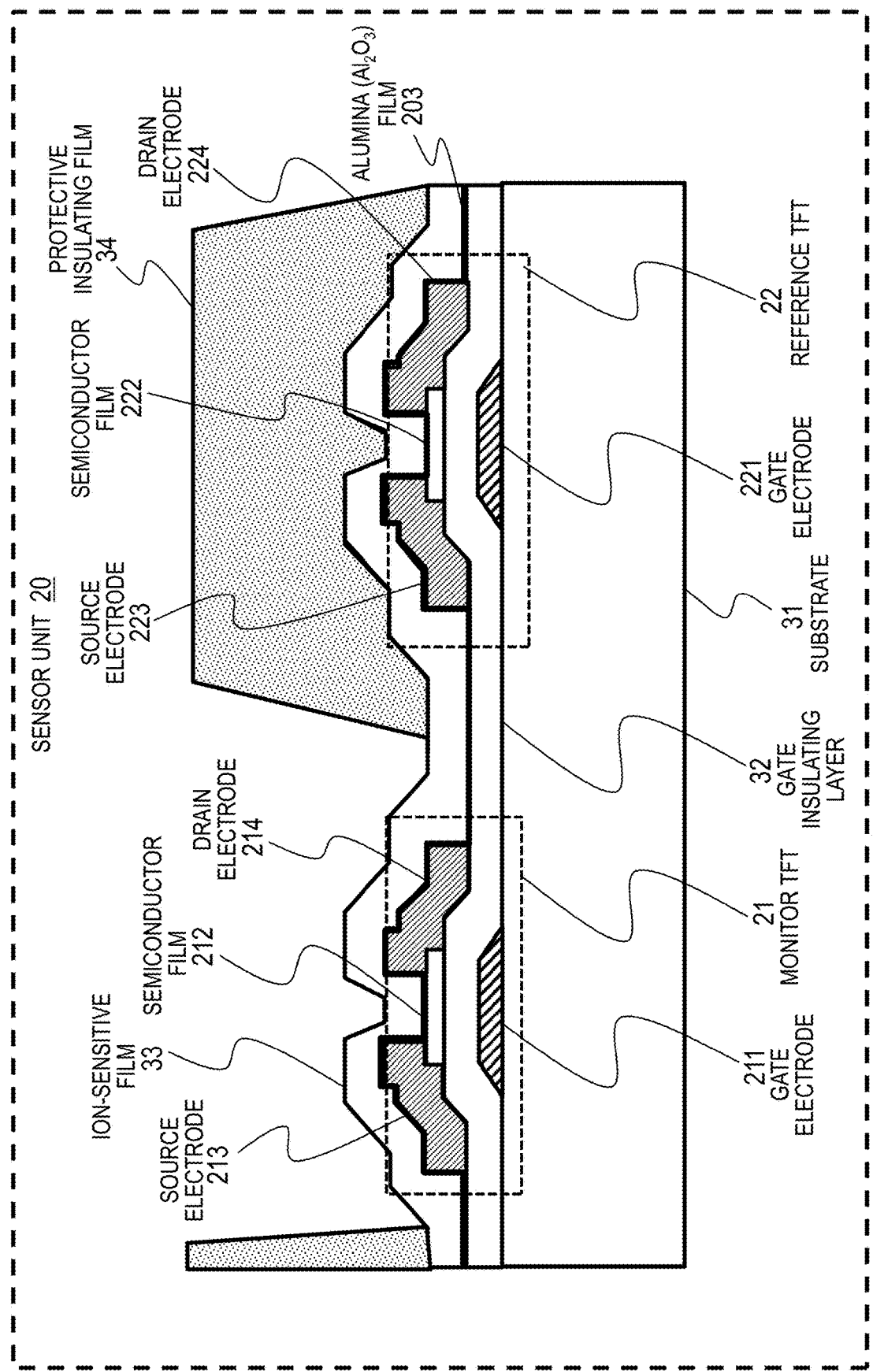
FIG. 4B is a cross-sectional diagram of another configuration example of the sensor unit.

FIG. 4B is a cross-sectional diagram of another configuration example of the sensor unit 20. The difference from the configuration example illustrated in FIG. 4A is described. The sensor unit 20 includes an alumina film 203 in addition to the configuration example in FIG. 4A. The alumina film 203 is interposed between the ion-sensitive film 33 and the monitor TFT 21 and between the ion-sensitive film 33 and the reference TFT 22 to cover the monitor TFT 21 and the reference TFT 22. A sophisticated alumina film 203 can be formed by atomic layer deposition (ALD), for example. The sensor unit 20 is mostly used in an environment where the sensor unit 20 is immersed in liquid. The alumina film 203 reduces the effects of moisture onto the characteristics of the monitor TFT 21 and the reference TFT 22.

Figure 5:
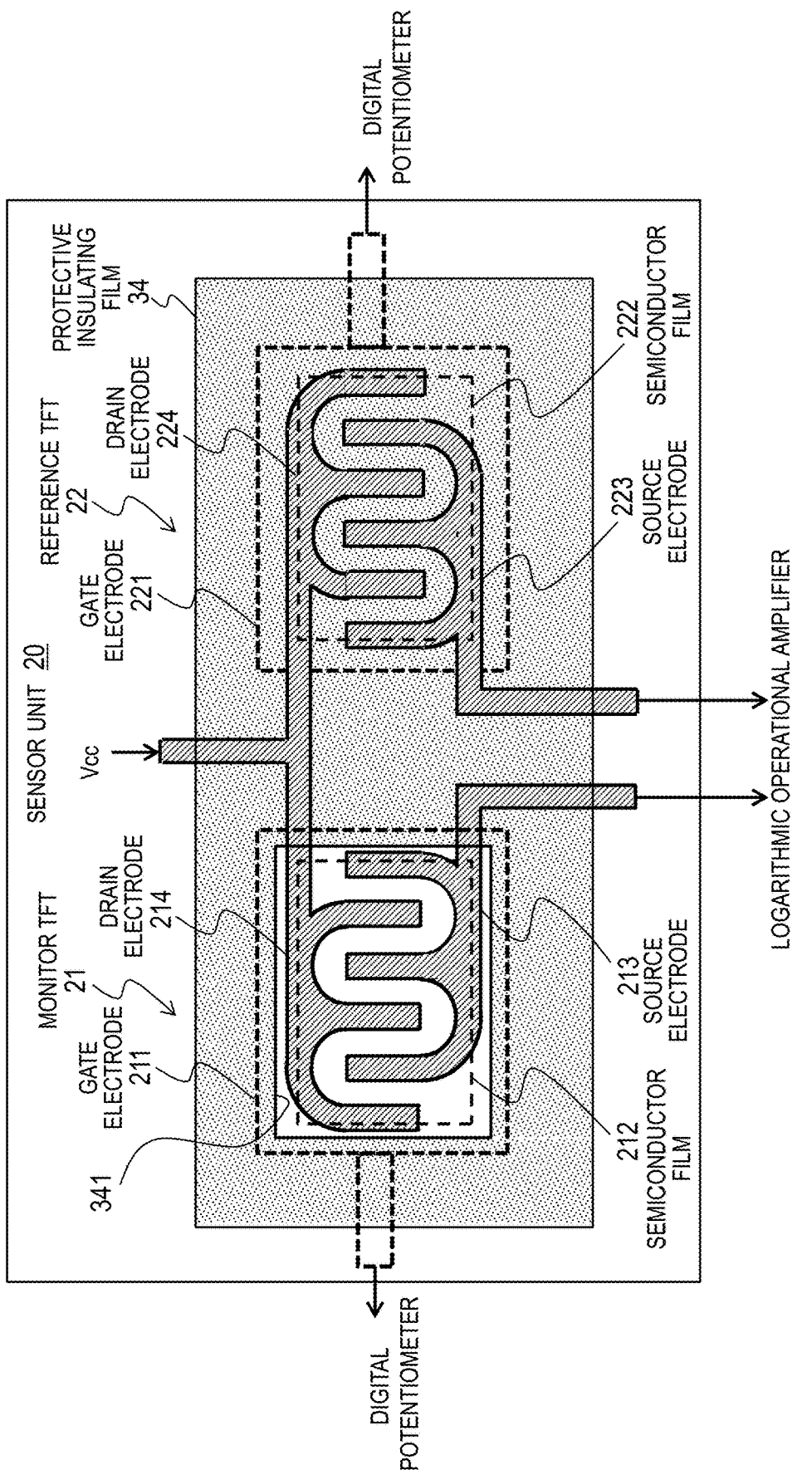
FIG. 5 is a plane diagram of a configuration example of the sensor unit.

FIG. 5 is a plane diagram of a configuration example of the sensor unit 20. As illustrated in FIG. 5, the monitor TFT 21 and the reference TFT 22 have multi-finger source/drain electrode patterns of the identical shapes, equal channel lengths, and equal channel widths. The channel width of the two TFTs is determined so that the operating points of the TFTs when being provided current values for sensing are in the subthreshold operation region.

The monitor TFT 21 is exposed from an opening 341 provided in the protective insulating film 34. Accordingly, the monitor TFT 21 contacts the object to be measured. In contrast, the reference TFT 22 covered with the protective insulating film 34 does not contact the object to be measured to be isolated.

Figure 6:
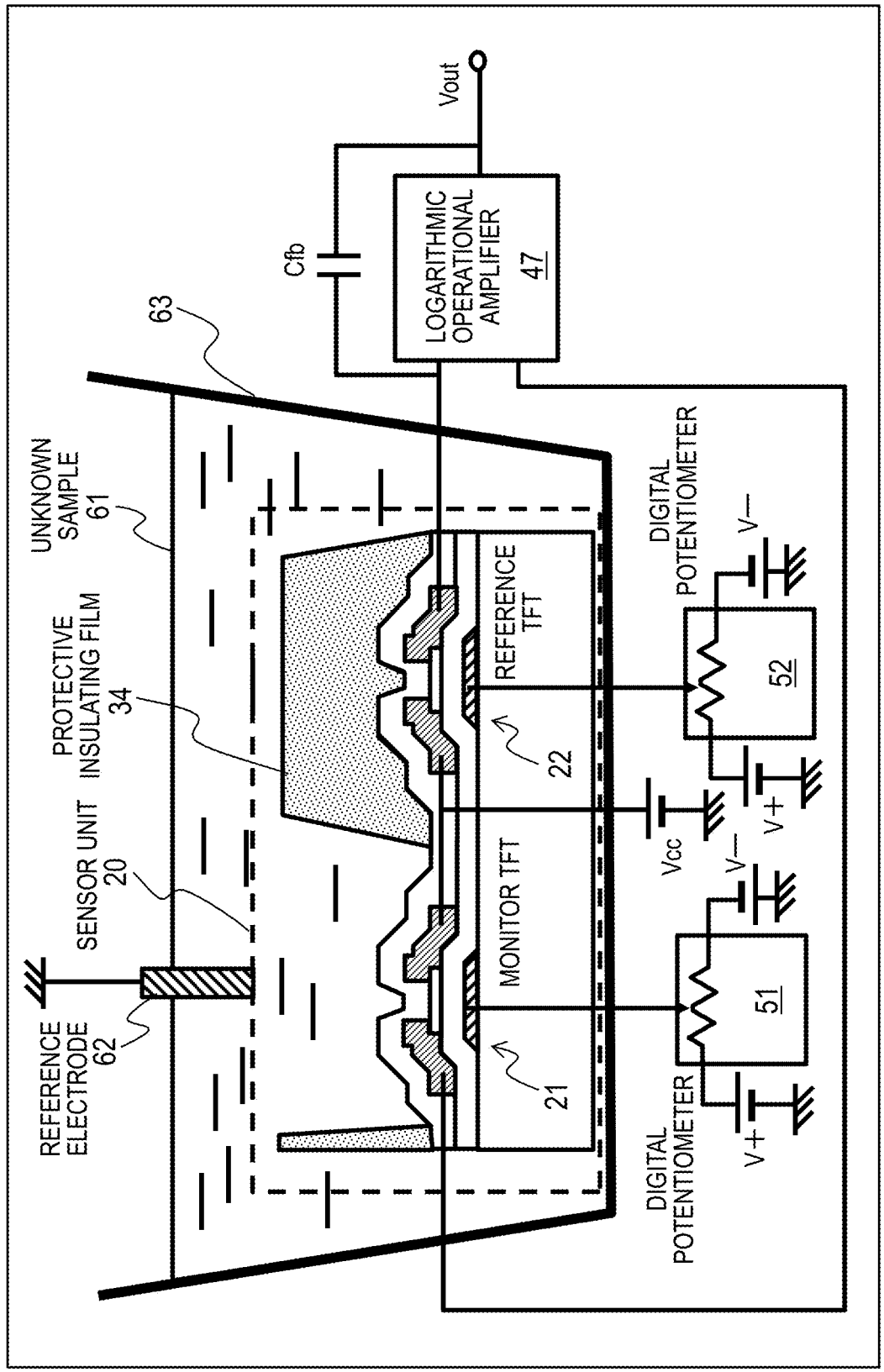
FIG. 6 illustrates the TFT sensor device in measuring the pH of an object (unknown sample) to be measured.

FIG. 6 illustrates the TFT sensor device 1 in measuring the pH of an object (unknown sample) to be measured. FIG. 6 partially omits the configuration of the TFT sensor device 1. The unknown sample 61 is contained in a receptacle 63. The sensor unit 20 is immersed in the unknown sample 61. As described above, only the monitor TFT 21 is in contact with the unknown sample 61 through the ion-sensitive film 33 and the reference TFT 22 is isolated from the unknown sample 61 by the protective insulating film 34.

A reference electrode 62 is provided distant from the ion-sensitive film 33. The reference electrode 62 is immersed in the unknown sample 61; the space from the ion-sensitive film 33 to the reference electrode 62 is filled with the unknown sample 61. The reference electrode 62 is provided with a predetermined potential. Although the ground potential is provided to the reference electrode 62 in the example of FIG. 6, the potential to be provided is determined as appropriate depending on the characteristics of the sensor unit 20.

In FIG. 6, the digital potentiometers 51 and 52 apply gate potentials to the monitor TFT 21 and the reference TFT 22, respectively. The output currents (drain currents) of the monitor TFT 21 and the reference TFT 22 are supplied to the logarithmic operational amplifier 47. The output value of the logarithmic operational amplifier 47 corresponds to the value in accordance with the differential degree between the output currents.

In the measurement on the unknown sample 61, the gate potential to be applied by the digital potentiometer 51 to the monitor TFT 21 is adjusted in accordance with the output value of the logarithmic operational amplifier 47. Specifically, the gate potential to be applied to the monitor TFT 21 is adjusted to equalize the output current value of the monitor TFT 21 to the output current value of the reference TFT 22.

Overall Operation of TFT Sensor Device

Figure 7:
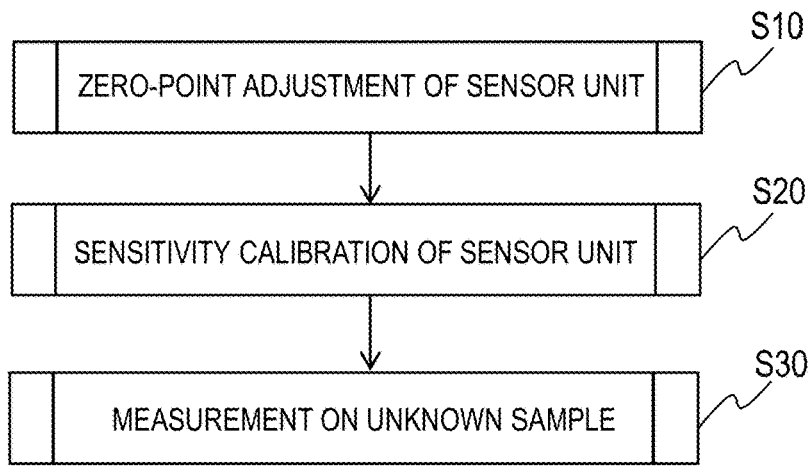
FIG. 7 is a flowchart of overall operation of the TFT sensor device.

Hereinafter, operation of the TFT sensor device 1 is described with reference to FIGS. 3, and 7 to 10. FIG. 7 is a flowchart of overall operation of the TFT sensor device 1. The TFT sensor device 1 performs initial setting before measurement on an unknown sample. Specifically, the TFT sensor device 1 performs zero-point adjustment of the sensor unit 20 (S10), and further, calibrates the sensitivity of the sensor unit 20 (S20). After the zero-point adjustment (S10) and the sensitivity calibration (S20) of the sensor unit 20, the TFT sensor device 1 measures the pH of the unknown sample (S30).

Zero-Point Adjustment

First, zero-point adjustment of the sensor unit 20 (S10) is described. The zero-point adjustment (S10) is performed to eliminate the mismatch of characteristics such as threshold voltage Vth between the monitor TFT 21 and the reference TFT 22.

Figure 8:
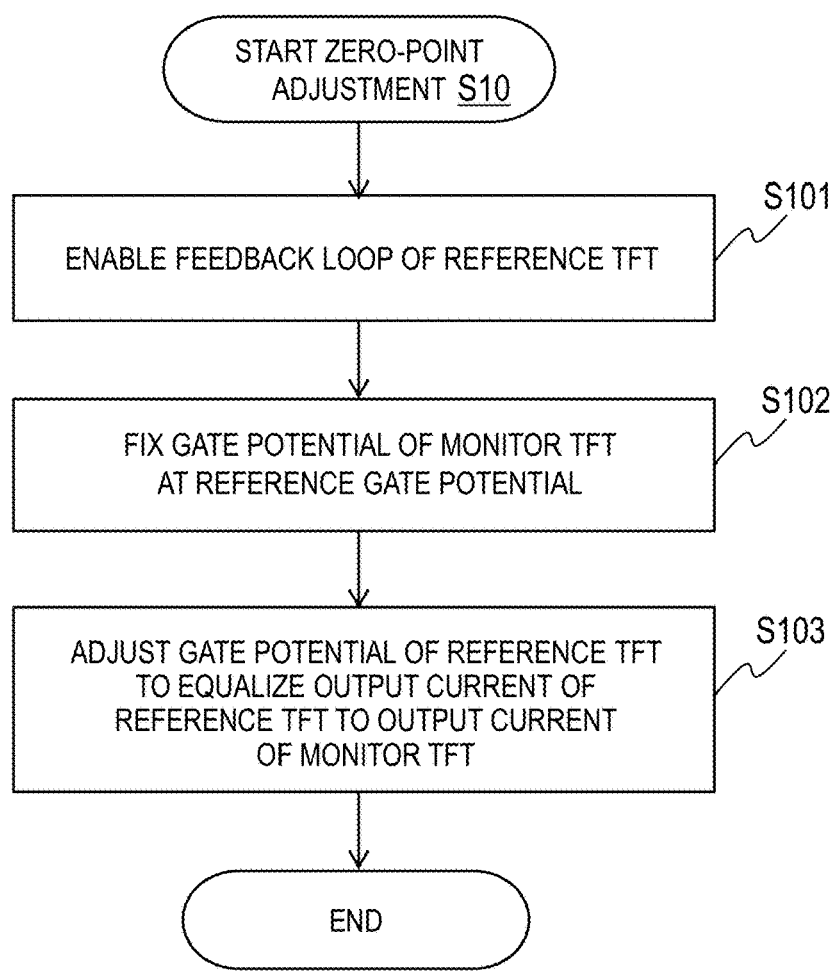
FIG. 8 is a flowchart of the details of zero-point adjustment of the sensor unit.

FIG. 8 is a flowchart of the details of the zero-point adjustment of the sensor unit 20. First, the control unit 40 enables the feedback loop of the reference TFT 22 (S101). Specifically, the control unit 40 opens the switch S1 and closes the switch S2. As a result, the feedback loop of the reference TFT 22 becomes operable.

Next, the control unit 40 fixes the gate potential of the monitor TFT 21 at a reference gate potential (S102). Specifically, the control unit 40 closes the switch S0. The reference gate potential is the ground potential (0 mV) in the configuration example of FIG. 3. Further, the control unit 40 sets the reference data Dref of the computing unit 45 to 0 V. Assume that the operating points of the two TFTs are in the subthreshold region under this reference gate potential.

If the threshold voltages Vth of the two TFTs are significantly shifted positively or negatively and their operating points at this 0 V are out of the subthreshold region, the control unit 40 adjusts the reference gate potential to a positive or negative value as appropriate to make the operating points fall in the subthreshold region. The monitor TFT 21 is set in the condition not to sense anything, or the same condition as the reference TFT 22.

Next, the control unit 40 adjusts the gate potential of the reference TFT 22 to equalize the output current Id(ref) of the reference TFT 22 to the output current Id(mon) of the monitor TFT 21 (S103). The control unit 40 adjusts the output voltage of the digital potentiometer 52 with the feedback system so that the output voltage Vout of the logarithmic operational amplifier 47 becomes zero.

Specifically, the computing unit 45 compares the digital value Dout1 of the output voltage Vout of the logarithmic operational amplifier 47 converted by the ADC 46 with the reference data Dref and outputs a value in accordance with the differential degree therebetween. For example, the computing unit 45 outputs a signal to the control circuit 42 until the digital value Dout1 of the output voltage of the logarithmic operational amplifier 47 is equalized to the reference data Dref. The output signal (value) is different depending on whether the digital value Dout1 of the output voltage of the logarithmic operational amplifier 47 or the reference data Dref is higher.

If the output of the computing unit 45 indicates Dout1>Dref, the control circuit 42 outputs an UP signal to the digital potentiometer 52. If the output of the computing unit 45 indicates Dout1<Dref, the control circuit 42 outputs a DOWN signal to the digital potentiometer 52.

The digital potentiometer 52 operates its internal semiconductor switches in accordance with the instruction from the control circuit 42 to increase or decrease the output (gate potential) for the gate of the reference TFT 22 in synchronization with the clock signal from the clock generator 54. Since the output of the digital potentiometer 52 is the gate potential of the reference TFT 22, the output current value of the reference TFT 22 changes. The feedback loop keeps working until the output current value of the reference TFT 22 is equalized to the output current value of the monitor TFT 21 so that the output of the logarithmic operational amplifier 47 becomes zero.

The computing unit 45 may output different values depending on the difference between the digital value Dout1 of the output voltage of the logarithmic operational amplifier 47 and the reference data Dref. Then, the control circuit 42 determines the adjustment amount (inclusive of the positive sign or the negative sign) for the output of the digital potentiometer 52. The control circuit 42 beforehand holds information specifying the relations between outputs of the computing unit 45 and adjustment amounts.

The output of the digital potentiometer 52 (the gate potential of the reference TFT 22) when the output voltage Vout of the logarithmic operational amplifier 47 is 0 is the reference gate potential of the reference TFT 22 to perform measurement on a sample. During the measurement on the sample, the gate potential of the reference TFT 22 is maintained at the reference gate potential. The control unit 40 can be configured to treat the output voltage Vout of the logarithmic operational amplifier 47 as 0 if the output voltage Vout of the logarithmic operational amplifier 47 is in a predetermined range including 0.

Sensitivity Calibration

Figure 9:
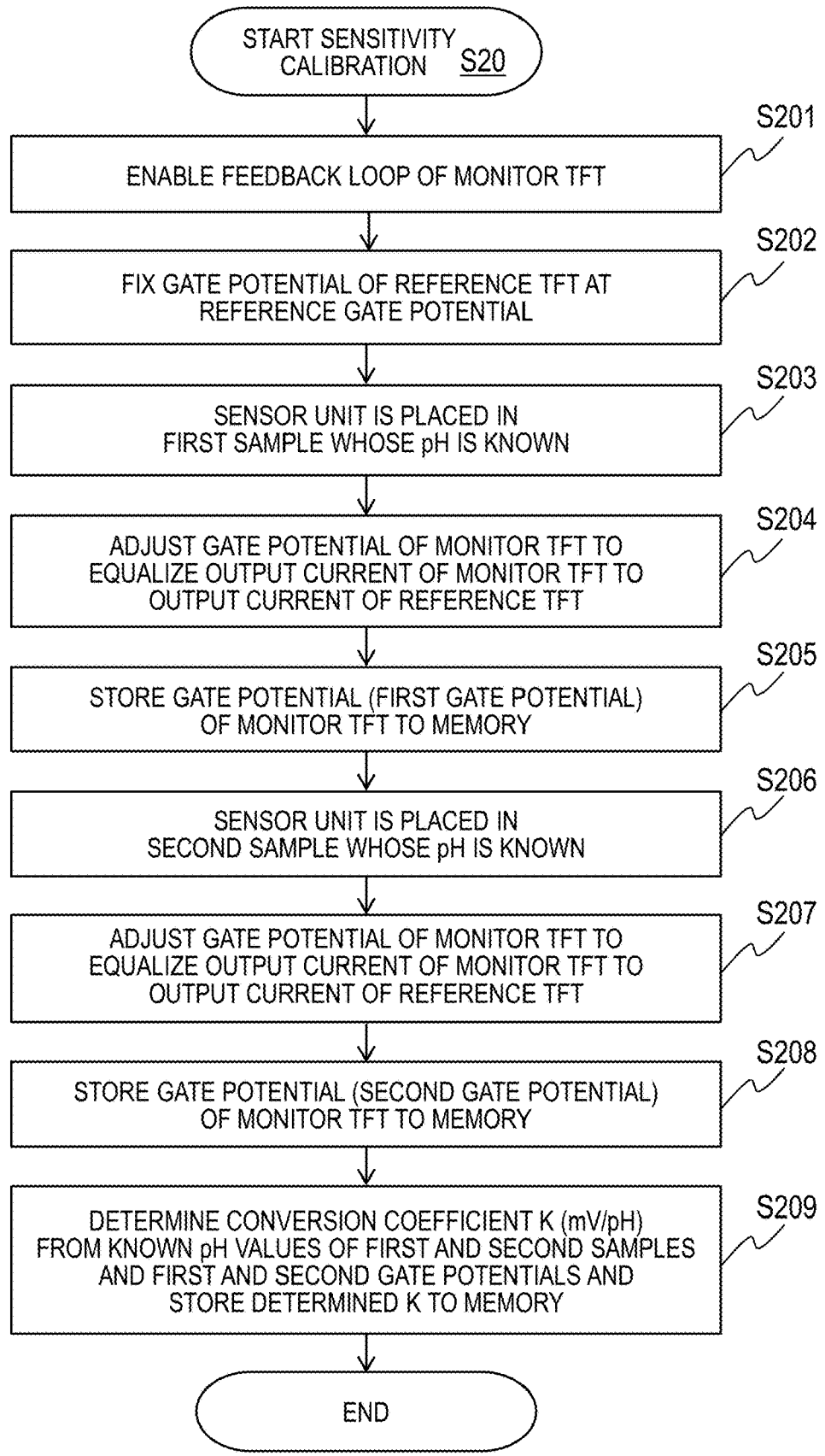
FIG. 9 is a flowchart of the details of sensitivity calibration of the sensor unit.

Next, sensitivity calibration of the sensor unit 20 (S20) is described. The sensitivity calibration (S20) identifies the relation between the Vth shift amount of the monitor TFT 21 and the measured pH value. FIG. 9 is a flowchart of the details of the sensitivity calibration of the sensor unit 20 (S20). The control unit 40 first enables the feedback loop of the monitor TFT 21 (S201). Specifically, the control unit 40 closes the switch S1 and opens the switch S2. The control unit 40 opens the switch S0 to allow change of the gate potential of the monitor TFT 21.

Next, the control unit 40 fixes the gate potential of the reference TFT 22 at a reference gate potential (S202). Specifically, the control circuit 42 controls the digital potentiometer 52 so that the reference gate potential determined in the zero-point adjustment (S10) is applied to the reference TFT 22.

Next, the monitor TFT 21 is placed in a first sample whose pH value is known (S203). The pH value of the first sample is stored in the non-volatile memory 49, for example. The control unit 40 adjusts the gate potential of the monitor TFT 21 to equalize the output current Id(mon) of the monitor TFT 21 to the output current Id(ref) of the reference TFT 22 (S204).

Specifically, the computing unit 45 compares the digital value Dout1 of the output voltage Vout of the logarithmic operational amplifier 47 converted by the ADC 46 with the reference data Dref and outputs a value in accordance with the differential degree therebetween. If the output of the computing unit 45 indicates Dout1>Dref, the control circuit 41 outputs an UP signal to the digital potentiometer 51. If the output of the computing unit 45 indicates Dout1<Dref, the control circuit 41 outputs a DOWN signal to the digital potentiometer 51.

The digital potentiometer 51 operates its internal semiconductor switches in accordance with the instruction from the control circuit 41 to increase or decrease the output (gate potential) for the gate of the monitor TFT 21 in synchronization with the clock signal from the clock generator 53. The adjustment of the output of the digital potentiometer 51 with the feedback loop is continued until the output current value of the monitor TFT 21 is equalized to the output current value of the reference TFT 22 so that the output voltage Vout of the logarithmic operational amplifier 47 becomes zero.

The difference between the output of the digital potentiometer 51 (the gate potential of the monitor TFT 21) when the output voltage Vout of the logarithmic operational amplifier 47 is 0 and the reference gate potential of the monitor TFT 21 in zero-point adjustment corresponds to the Vth shift amount of the monitor TFT 21 caused by the measurement sample. Although the reference gate potential in this example is the ground potential (0 mV), it is adjusted to a value other than 0 mV depending on the Vth values of the two TFT. The control unit 40 can be configured to treat the output voltage Vout of the logarithmic operational amplifier 47 as 0 if the output voltage Vout of the logarithmic operational amplifier 47 is in a predetermined range including 0.

The control unit 40 stores the gate potential (first gate potential) being applied to the monitor TFT 21 when the output voltage Vout of the logarithmic operational amplifier 47 has become 0 to the non-volatile memory 49 (S205). Specifically, the ADC 50 converts the analog output value of the digital potentiometer 51 to a digital value and outputs the digital value. The output (Dout2) of the ADC 50 indicates the output of the digital potentiometer 51 or the gate potential of the monitor TFT 21 in a digital value. The output (Dout2) of the ADC 50 indicating the gate potential of the monitor TFT 21 is stored to the non-volatile memory 49.

Next, the monitor TFT 21 is placed in a second sample whose pH value is known (S206). The pH value of the second sample is stored in the non-volatile memory 49, for example. The control unit 40 adjusts the gate potential of the monitor TFT 21 to equalize the output current Id(mon) of the monitor TFT 21 to the output current Id(ref) of the reference TFT 22 (S207).

Specifically, like in the measurement on the first sample, the control circuit 41 outputs an UP signal to the digital potentiometer 51 when the output of the computing unit 45 indicates Dout1>Dref. The control circuit 41 outputs a DOWN signal to the digital potentiometer 51 when the output of the computing unit 45 indicates Dout1<Dref.

The digital potentiometer 51 increases or decreases the output (gate potential) for the gate of the monitor TFT 21 in accordance with the instruction from the control circuit 41 in synchronization with the clock signal from the clock generator 53. The adjustment of the output of the digital potentiometer 51 with the feedback loop is continued until the output current value of the monitor TFT 21 is equaled to the output current value of the reference TFT 22 so that the output voltage Vout of the logarithmic operational amplifier 47 becomes 0. The control unit 40 can be configured to treat the output voltage Vout of the logarithmic operational amplifier 47 as 0 if the output voltage Vout of the logarithmic operational amplifier 47 is in a predetermined range including 0.

The control unit 41 stores the gate potential (second gate potential) being applied to the monitor TFT 21 when the output voltage Vout of the logarithmic operational amplifier 47 has become 0 to the non-volatile memory 49 (S208). Like the first gate potential, the output (Dout2) of the ADC 50 indicating the second gate potential of the monitor TFT 21 is stored to the non-volatile memory 49.

Next, the control unit 40 determines the conversion coefficient K (mV/pH) from the known pH values of the first and the second samples and the first and the second gate potentials and stores the conversion coefficient K to the non-volatile memory (S209). For example, the control circuit 41 acquires the first gate potential and the second gate potential stored at Steps S205 and S208 from the non-volatile memory 49.

The control circuit 41 further acquires the pH values of the first sample and the second sample from the non-volatile memory 49. The control circuit 41 determines the conversion coefficient K (mV/pH) from these four values. The conversion coefficient (mV/pH) is the inclination between two points determined from the four values in a space (graph) defined by the gate potential and the pH. After this determination, the computing unit 48 can calculate a pH value using the conversion coefficient K and the value of Dout2.

In the case of zero-point adjustment where the reference gate potential applied to the monitor TFT 21 through the switch S0 is different from the ground potential, the difference between the first gate potential and the reference gate potential of the monitor TFT 21 and the difference between the second gate potential and the reference gate potential of the monitor TFT 21 are used in place of the first gate potential and the second gate potential, respectively. The conversion coefficient K (mV/pH) can be determined based on an approximate straight line acquired by measuring the gate potential with three or more samples. The conversion coefficient can also be determined from a measurement result of the gate potential on one sample whose pH value is known, if a specific pair of a gate potential and a pH value is known.

Measurement on Unknown Sample

Figure 10:
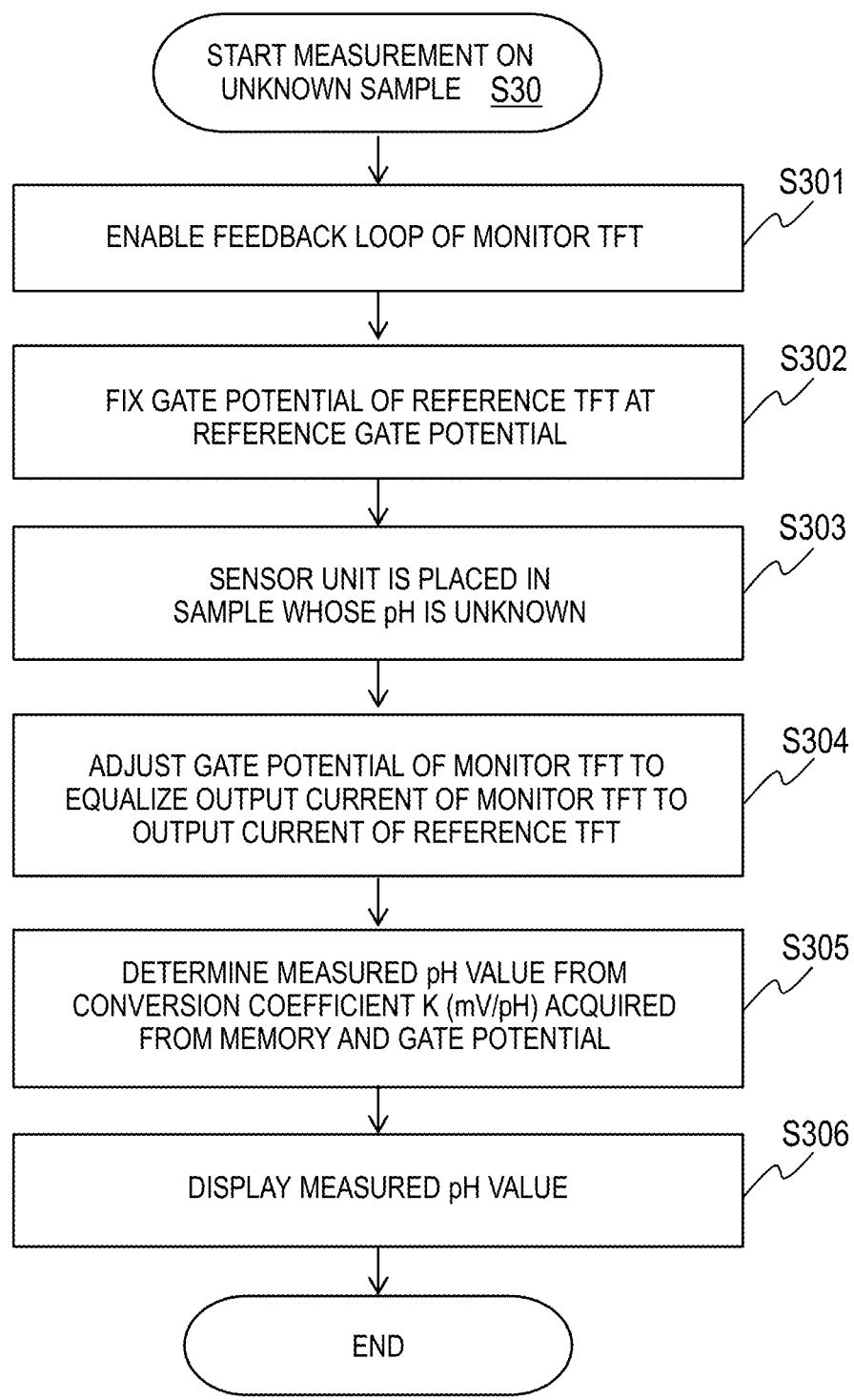
FIG. 10 is a flowchart of details of measurement on a sample whose pH is unknown.

Next, a method of measuring the unknown pH of a sample is described. FIG. 10 is a detailed flowchart of measuring the unknown pH of a sample (S30). The control unit 40 first enables the feedback loop of the monitor TFT 21 (S301). Specifically, the control unit 40 closes the switch S1 and opens the switch S2. The control unit 40 opens the switch S0 to allow change of the gate potential of the monitor TFT 21.

Next, the control unit 40 fixes the gate potential of the reference TFT 22 at the reference gate potential (S302). Specifically, the control circuit 42 controls the digital potentiometer 52 so that the reference gate potential determined in the zero-point adjustment (S10) is applied to the reference TFT 22.

Next, the monitor TFT 21 is placed in the sample whose pH is unknown (S303). The control unit 40 adjusts the gate potential of the monitor TFT 21 to equalize the output current Id(mon) of the monitor TFT 21 to the output current Id(ref) of the reference TFT 22 (S304).

Specifically, the computing unit 45 compares the digital value Dout1 of the output voltage Vout of the logarithmic operational amplifier 47 converted by the ADC 46 with the reference data Dref and outputs a value in accordance with the differential degree therebetween. If the output of the computing unit 45 indicates Dout1>Dref, the control circuit 41 outputs an UP signal to the digital potentiometer 51. If the output of the computing unit 45 indicates Dout1<Dref, the control circuit 41 outputs a DOWN signal to the digital potentiometer 51.

The digital potentiometer 51 operates the internal semiconductor switches in accordance with the instruction from the control circuit 41 to increase or decrease the output (gate potential) for the gate of the monitor TFT 21 in synchronization with the clock signal from the clock generator 53. The adjustment of the output of the digital potentiometer 51 with the feedback loop is continued until the output current value of the monitor TFT 21 is equalized to the output current value of the reference TFT 22 so that the output voltage Vout of the logarithmic operational amplifier 47 becomes 0.

Next, the control unit 40 determines the measured pH value of the unknown sample using the conversion coefficient K (mV/pH) acquired from the non-volatile memory 49 and the gate potential of the monitor TFT 21 (S305). Specifically, the computing unit 48 calculates the measured pH value of the unknown sample from the conversion coefficient K (mV/pH) acquired from the non-volatile memory 49 and the convergent output value Dout2 of the ADC 50. The convergent value (Dout2) of the potentiometer 51 is the gate potential of the monitor TFT 21.

In the case of zero-point adjustment where the reference gate potential applied to the monitor TFT 21 through the switch S0 is different from the ground potential, the difference between the convergent output value Dout2 of the ADC 50 and the reference gate potential of the monitor TFT 21 is used in place of the convergent output value Dout2 of the ADC 50.

Next, the control unit 40 displays the measured pH value of the unknown sample on the indicator 44 (S306). The display circuit 43 generates image data from the data of the pH value output from the computing unit 48 and outputs it to the indicator 44.

As described above, the differential detection using a TFT pair can reduce the effects of environmental condition changes on pH measurement during the measurement. The above-described example changes the gate potential of the monitor TFT 21 to equalize the output current of the monitor TFT 21 to the output current of the reference TFT 22. This configuration achieves more accurate measurement of the pH of the sample. Unlike this configuration, the difference between the output current of the monitor TFT 21 and the output current of the reference TFT 22 and conversion information prepared beforehand can be used to calculate the shift amount of the gate potential or the pH value of the sample.

The sensitivity calibration (S20) and/or the measurement on an unknown sample (S30) can be modified so that the gate potential of the monitor TFT 21 is fixed and the gate potential of the reference TFT 22 is adjusted to equalize the output current of the reference TFT 22 to the output current of the monitor TFT 21. This configuration also achieves accurate measurement of the pH of a sample.

Another Configuration Example

The above-described configuration example uses a logarithmic operational amplifier 47 to measure the difference between the output current of the monitor TFT 21 and the output current of the reference TFT 22. The TFT sensor device 1 can employ a linear operational amplifier, instead of the logarithmic operational amplifier 47.

Figure 11:
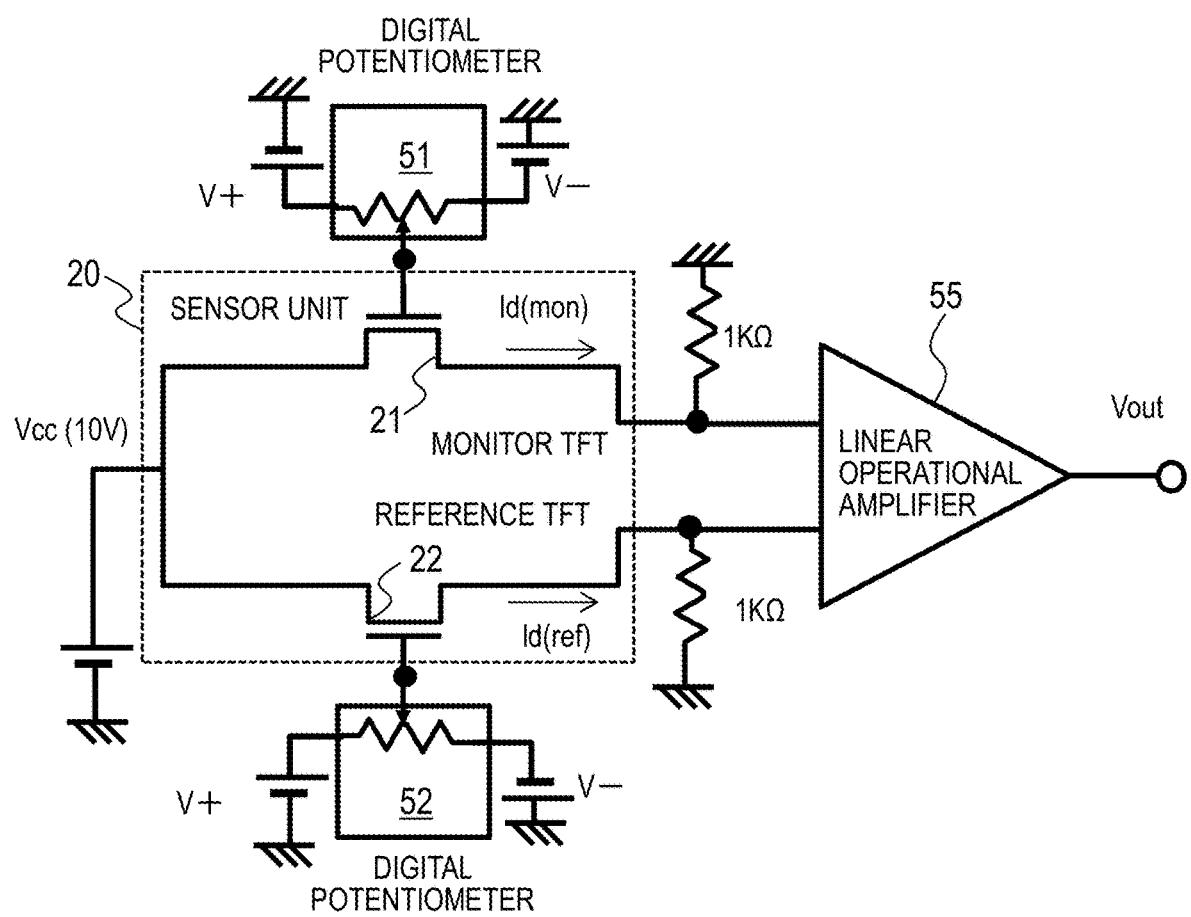
FIG. 11 is a configuration example of a TFT sensor device including a linear operational amplifier instead of a logarithmic operational amplifier.

FIG. 11 illustrates a configuration example of a TFT sensor device 1 including a linear operational amplifier 55 in place of the logarithmic operational amplifier 47. The linear operational amplifier 55 outputs a value based on the differential degree between two inputs. Specifically, the linear operational amplifier 55 outputs a value in accordance with the difference between two inputs. A resistor is connected between the ground and a node provided between the output of the monitor TFT 21 and the input of the linear operational amplifier 55. In similar, another resistor is connected between the ground and a node provided between the output of the reference TFT 22 and the input of the linear operational amplifier 55. The remaining configuration is the same as the configuration described with reference to FIG. 3.

The configuration example described with reference to FIG. 3 makes the monitor TFT 21 and the reference TFT 22 operates in the subthreshold region (weak inversion region). This configuration example makes the monitor TFT 21 and the reference TFT 22 operates in the strong inversion region, which raises the sensitivity. The monitor TFT 21 and the reference TFT 22 can be operated in the subthreshold region. In this configuration example, the output voltage Vout of the linear operational amplifier 55 is not the same as the Vth shift amount of the sensor TFTs and therefore, conversion from the measured value is required.

As set forth above, embodiments of this disclosure have been described; however, this disclosure is not limited to the foregoing embodiments. Those skilled in the art can easily modify, add, or convert each element in the foregoing embodiment within the scope of this disclosure. A part of the configuration of one embodiment can be replaced with a configuration of another embodiment or a configuration of an embodiment can be incorporated into a configuration of another embodiment.

What is claimed is:

1. An ion sensor device comprising:
   a monitor thin film transistor;
   a reference thin film transistor; and
   a control unit configured to determine a value measured from a sample based on a ratio between output current of the reference thin film transistor and output current of the monitor thin film transistor,
   wherein the control unit includes a logarithmic operational amplifier configured to receive the output current of the reference thin film transistor and the output current of the monitor thin film transistor to determine the ratio,
   wherein a control unit includes a feedback loop which controls a gate potential of the reference thin film transistor to make the reference thin film transistor operate in a sub threshold region,
   wherein the control unit includes another feedback loop which controls a gate potential of the monitor thin film transistor to make the monitor thin film transistor operate in a sub threshold region,
   wherein the control unit is configured to:
   determine a shift amount of threshold voltage of the monitor thin film transistor caused by measurement on the sample based on the ratio between output current of the reference thin film transistor and output current of the monitor thin film transistor in performing the measurement on the sample; and
   determine the value measured from the sample based on the shift amount,
   wherein the control unit is configured to determine the shift amount by changing the gate potential of either the reference thin film transistor or the monitor thin film transistor to equalize output current of the reference thin film transistor and output current of the monitor thin film transistor, and
   wherein the control unit is configured to perform measurement on another sample whose value to be measured is known before performing the measurement on the sample to determine a relation between the shift amount and the value measured from the sample.

2. The ion sensor device according to claim 1, wherein the control unit is configured to apply a reference potential to one of the reference thin film transistor and the monitor thin film transistor and adjust gate potential of the other one of the reference thin film transistor and the monitor thin film transistor to equalize output current of the reference thin film transistor and output current of the monitor thin film transistor before performing the measurement on the sample.

3. The ion sensor device according to claim 1, wherein the reference thin film transistor and the monitor thin film transistor are oxide semiconductor thin film transistors.

4. An ion sensor device comprising:
a monitor thin film transistor;
a reference thin film transistor;
a control unit configured to determine a value measured from a sample based on a ratio between output current of the reference thin film transistor and output current of the monitor thin film transistor;
an alumina film covering the monitor thin film transistor and the reference thin film transistor; and
an ion-sensitive film covering the alumina film.

* * * * *